(12) United States Patent
Wang et al.

(10) Patent No.: US 8,949,696 B2
(45) Date of Patent: Feb. 3, 2015

(54) SYSTEMS AND METHODS FOR TRAPPING SET DISRUPTION

(71) Applicant: LSI Corporation, San Jose, CA (US)

(72) Inventors: Chung-Li Wang, San Jose, CA (US);
Fan Zhang, Milpitas, CA (US); Qi Qi,
San Jose, CA (US); Shu Li, San Jose,
CA (US); Shaohua Yang, San Jose, CA
(US)

(73) Assignee: LSI Corporation, San Jose, CA (US)

( * ) Notice: Subject to any disclaimer, the term of this patent is extended or adjusted under 35 U.S.C. 154(b) by 122 days.

(21) Appl. No.: 13/770,030

(22) Filed: Feb. 19, 2013

(65) Prior Publication Data

US 2014/0237313 A1     Aug. 21, 2014

(51) Int. Cl.
| | |
|---|---|
| *H03M 13/00* | (2006.01) |
| *G11B 20/18* | (2006.01) |
| *H03M 13/11* | (2006.01) |
| *H03M 13/29* | (2006.01) |

(52) U.S. Cl.
CPC ....... *G11B 20/1833* (2013.01); *H03M 13/1111* (2013.01); *H03M 13/1117* (2013.01); *H03M 13/1122* (2013.01); *H03M 13/1128* (2013.01); *H03M 13/1142* (2013.01); *H03M 13/6331* (2013.01); *H03M 13/6343* (2013.01); *H03M 13/658* (2013.01); *H03M 13/2957* (2013.01)
USPC .......................................... 714/776; 714/785

(58) Field of Classification Search
USPC ................................................. 714/776, 785
See application file for complete search history.

(56) References Cited

U.S. PATENT DOCUMENTS

| | | |
|---|---|---|
| 5,701,314 A | 12/1997 | Armstrong |
| 5,712,861 A | 1/1998 | Inoue |
| 5,797,020 A | 8/1998 | Bonella et al. |
| 6,185,620 B1 | 2/2001 | Weber et al. |
| 6,405,342 B1 | 6/2002 | Lee |
| 6,438,717 B1 | 8/2002 | Butler |
| 6,657,803 B1 | 12/2003 | Ling |
| 6,662,336 B1 * | 12/2003 | Zook ............................. 714/786 |
| 7,076,719 B2 | 7/2006 | Anjo et al. |
| 7,136,244 B1 | 11/2006 | Rothberg |
| 7,702,989 B2 | 4/2010 | Graef |
| 7,730,384 B2 | 6/2010 | Graef |
| 7,738,201 B2 | 6/2010 | Jin |
| 7,971,125 B2 | 6/2011 | Graef |
| 7,990,642 B2 | 8/2011 | Lee |
| 8,085,751 B2 * | 12/2011 | Oh et al. ....................... 370/345 |

(Continued)

FOREIGN PATENT DOCUMENTS

| | | |
|---|---|---|
| EP | 2242054 A2 | 10/2010 |
| WO | WO 2008/087042 A1 | 7/2008 |
| WO | WO 2011/091845 a1 | 8/2011 |

OTHER PUBLICATIONS

Chase, D, "A Class of Algorithms for Decoding Block Codes with Channel Measurement Information" IEEE Transactions on Info theory, vol. 18, No. 1 Jan. 1, 1972.

(Continued)

*Primary Examiner* — M. Mujtaba K Chaudry
(74) *Attorney, Agent, or Firm* — Hamilton DeSanctis & Cha

(57) ABSTRACT

The present inventions are related to systems and methods for data processing, and more particularly to systems and methods for performing data decoding including utilization of different scaling values on a portion by portion basis during the data decoding.

20 Claims, 7 Drawing Sheets

(56) References Cited

U.S. PATENT DOCUMENTS

| | | | |
|---|---|---|---|
| 8,176,404 | B2 | 5/2012 | Yang |
| 8,782,500 | B2* | 7/2014 | Weingerten .................. 714/785 |
| 2008/0226180 | A1* | 9/2008 | Hsieh ........................... 382/232 |
| 2010/0241931 | A1* | 9/2010 | Choi et al. .................... 714/776 |
| 2011/0029846 | A1* | 2/2011 | Stankovic et al. ............ 714/785 |
| 2011/0080211 | A1 | 4/2011 | Yang |
| 2011/0161633 | A1 | 6/2011 | Xu |
| 2012/0198129 | A1 | 8/2012 | Van Aken et al. |
| 2012/0200954 | A1 | 8/2012 | Jin |
| 2012/0236429 | A1 | 9/2012 | Yang |

OTHER PUBLICATIONS

Dong-U Lee et al "Pilotless Frame Synchronization via LDPC Code Constraint Feedback" IEEE Comm. Letters, NJ, US vol. 11 No. 8, Aug. 1, 2007.

Olmos et al., "Tree-Structure Expectation Propagation for LDPC Decoding in Erasure Channels", Cornell University Library arXiv:1009.4287 (Sep. 22, 2010).

U.S. Appl. No. 13/474,672, filed May 17, 2012, Fan Zhang, Unpublished.

U.S. Appl. No. 13/465,214, filed May 7, 2012, Chung-Li Wang, Unpublished.

U.S. Appl. No. 13/326,363, filed Dec. 15, 2011, Fan Zhang, Unpublished.

U.S. Appl. No. 13/372,600, filed Feb. 14, 2012, Shaohua Yang, Unpublished.

U.S. Appl. No. 13/326,367, filed Dec. 15, 2011, Shaohua Yang, Unpublished.

U.S. Appl. No. 13/483,982, filed May 30, 2012, Yang Han, Unpublished.

U.S. Appl. No. 13/412,492, filed Mar. 5, 2012, Shaohua Yang, Unpublished.

U.S. Appl. No. 13/445,858, filed Apr. 12, 2012, Johnson Yen, Unpublished.

U.S. Appl. No. 13/459,282, filed Apr. 30, 2012, Fan Zhang, Unpublished.

U.S. Appl. No. 13/692,908, filed Dec. 3, 2012, Fan Zhang, Unpublished.

U.S. Appl. No. 13/560,737, filed Jul. 27, 2012, Weijun Tan, Unpublished.

U.S. Appl. No. 13/602,440, filed Sep. 4, 2012, Fan Zhang, Unpublished.

U.S. Appl. No. 13/644,542, filed Oct. 4, 2012, Shaohua Yang, Unpublished.

U.S. Appl. No. 13/644,589, filed Oct. 4, 2012, Shaohua Yang, Unpublished.

U.S. Appl. No. 13/490,849, filed Jun. 7, 2012, Johnson Yen, Unpublished.

* cited by examiner

SYSTEMS AND METHODS FOR TRAPPING SET DISRUPTION

FIELD OF THE INVENTION

The present inventions are related to systems and methods for data processing, and more particularly to systems and methods for performing data decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. In some cases, the corruption cannot be corrected using standard processing.

Hence, for at least the aforementioned reasons, there exists a need in the art for advanced systems and methods for data decoding.

BRIEF SUMMARY

The present inventions are related to systems and methods for data processing, and more particularly to systems and methods for performing data decoding.

Various embodiments of the present invention provide data processing systems that include a data processing system that includes a data decoder circuit. The data decoder circuit is operable to apply a data decode algorithm to a decoder input to yield a decoded output. The decoder input includes at least a first portion and a second portion. Applying the data decoding algorithm to the decoder input includes: determining a first condition associated with the first portion; determining a second condition associated with the second portion; applying a first scaling value to the first portion based at least in part upon the first condition, and applying a second scaling value to the second portion based at least in part upon the second condition.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
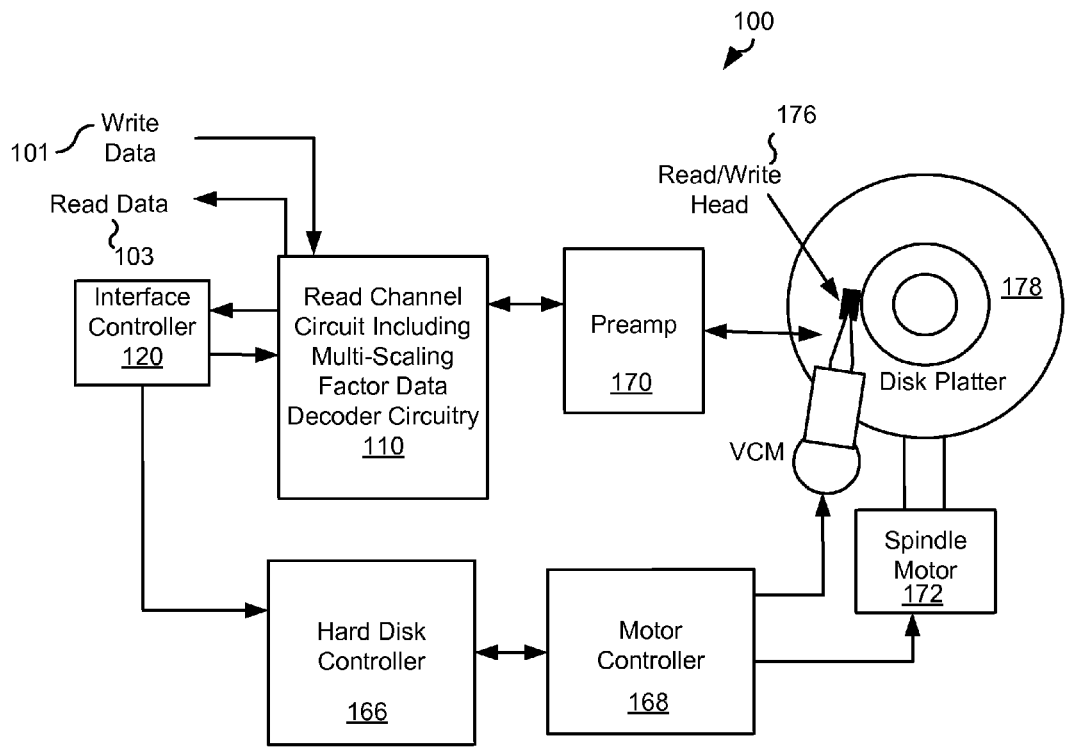
FIG. 1 shows a storage system including a read channel circuit having multi-scaling value data decoder circuitry in accordance with various embodiments of the present invention.

The present inventions are related to systems and methods for data processing, and more particularly to systems and methods for performing data decoding.

In some embodiments of the present invention a data processing system is disclosed that includes a data detector circuit and a data decoder circuit. The data detector circuit is operable to apply a data detection algorithm to a codeword to yield a detected output, and the data decoder circuit is operable to apply a data decode algorithm to a decoder input derived from the detected output to yield a decoded output. Processing a codeword through both the data detector circuit and the data decoder circuit is generally referred to as a "global iteration". During a global iteration, the data decode algorithm may be repeated applied. Each application of the data decode algorithm during a given global iteration is referred to as a "local iteration".

In some embodiments of the present invention, application of the data decode algorithm includes generation of check node to variable node (c2v) messages and variable node to check node (v2c) messages as is known in the art. These messages are generated by multiplying an un-scaled message by multiple scaling values. As an example, in one embodiment of the present invention, the messages are scaled by multiplying by a first scaling value when a trapping set is not indicated. As used herein, the phrase "trapping set" is used in its broadest sense to mean any condition indicating that continued processing of a data set is unlikely to converge (i.e., to correct all errors). A second scaling value is used for a subset of a processing data set where a trapping set is indicated somewhere in the processing data set and the subset of the processing data set includes errors (e.g., unsatisfied parity check equations for the subset of the processing data set). A third scaling value is used for another subset of the processing data set where a trapping set is indicated somewhere in the processing data set and the subset of the processing data set does not include errors.

Various embodiments of the present invention provide data processing systems that include a data processing system that includes a data decoder circuit. The data decoder circuit is operable to apply a data decode algorithm to a decoder input to yield a decoded output. The decoder input includes at least a first portion and a second portion. Applying the data decoding algorithm to the decoder input includes: determining a first condition associated with the first portion; determining a second condition associated with the second portion; applying a first scaling value to the first portion based at least in part upon the first condition, and applying a second scaling value to the second portion based at least in part upon the second condition. In some instances of the aforementioned embodiments, the data processing system is implemented as an integrated circuit. In one or more embodiments of the present invention, the data processing system is incorporated in a storage device. In other embodiments of the present invention, the data processing system is incorporated in a data transmission device.

In some instances of the aforementioned embodiments, determining the first condition includes: calculating a syndrome of the first portion to yield a first syndrome value, and wherein the first condition is a zero value of the first syndrome; and calculating a syndrome of the second portion to yield a second syndrome value, and wherein the second condition is a non-zero value of the second syndrome. In various instances of the aforementioned embodiments, the first portion is a first row of the decoder input, and the second portion is a second row of the decoder input. In one or more instances of the aforementioned embodiments, applying the data decoding algorithm to the decoder input further includes: determining a third condition associated with the decoder input; and applying a third scaling value to both the first portion and the second portion based at least in part upon the third condition. In some such instances, the third condition is the absence of a trapping set associated with the decoder input. In various instances of the aforementioned embodiments, applying the data decoding algorithm to the decoder input further includes: determining a third condition associated with the decoder input. In such instances, applying the first scaling value to the first portion is based at least in part upon a combination of the first condition and the third condition, and applying the second scaling value to the second portion is based at least in part upon a combination of the second condition and the third condition. In some cases, the third condition is the occurrence of a trapping set associated with the decoder input.

Other embodiments of the present invention provide methods for data processing that include: receiving a decoder input where the decoder input includes a first portion and a second portion; and applying a data decoding algorithm to the decoder input by a data decoder circuit. Applying the data decoding algorithm includes: determining a first condition associated with the first portion; determining a second condition associated with the second portion; applying a first scaling value to the first portion based at least in part upon the first condition, and applying a second scaling value to the second portion based at least in part upon the second condition. In some instances of the aforementioned embodiments, determining the first condition includes: calculating a syndrome of the first portion to yield a first syndrome value where the first condition is a zero value of the first syndrome; and calculating a syndrome of the second portion to yield a second syndrome value. The second condition is a non-zero value of the second syndrome. In other instances of the aforementioned embodiments, the first portion is a first row of the decoder input, and the second portion is a second row of the decoder input. In some instances of the aforementioned embodiments, applying the data decoding algorithm to the decoder input further includes: determining a third condition associated with the decoder input where the third condition is the absence of a trapping set associated with the decoder input; and applying a third scaling value to both the first portion and the second portion based at least in part upon the third condition. In yet other instances of the aforementioned embodiments, applying the data decoding algorithm to the decoder input further includes: determining a third condition associated with the decoder input where the third condition is the occurrence of a trapping set associated with the decoder input. In such instances, applying the first scaling value to the first portion is based at least in part upon a combination of the first condition and the third condition, and applying the second scaling value to the second portion is based at least in part upon a combination of the second condition and the third condition.

Turning to FIG. 1, a storage system 100 including a read channel circuit 110 having multi-scaling value data decoder circuitry in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a data decoder circuit that includes an ability to apply different scaling values during a single local iteration through the data decoder circuit. As an example, one scaling value may be applied to processing one row of a data set, and a different scaling value applied to processing a different row of the same data set. As sued herein, a "row" of a data set is a portion of a data set associated with a selected characteristic. In one particular case, a row of a data set is a portion of a data set associated with a particular parity check equation. The scaling value that is to be applied to a particular row may be selected based upon one or more characteristics. For example, in one particular embodiment of the present invention, a first scaling value is selected for all rows of a given data set where no trapping set is indicated. One of a second scaling value or a third scaling value is selected when a trapping set is indicated. In such a situation where a trapping set is indicated, the second scaling value is used where there are no errors indicated on the particular row, and the third scaling value is used where there are errors indicated on the particular row. Such an approach of using different scaling values during a given local iteration of a data decoding circuit may be used to overcome a trapping set that otherwise impedes the possibility of convergence of the data decoder circuit. Based upon the disclosure provided herein, one of ordinary skill in the art will recognize a variety of other advantages that may be achieved through use of one or more embodiments of the present invention. In some cases, read channel circuit 110 may be implemented to include a data processing circuit similar to that discussed below in relation to FIG. 3. The data processing circuit may include a data decoder circuit including multi-scaling value circuitry similar to that discussed below in relation to FIG. 4. In one or more embodiments of the present invention, the data processing may be performed similar to that discussed below in relation to FIGS. 5a-5d. Alternatively, or in addition, the data processing may be performed similar to that discussed below in relation to FIG. 6. FIGS. 5a-5d are particularly tailored to real time processing, and FIG. 6 is particularly tailored to retry processing.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
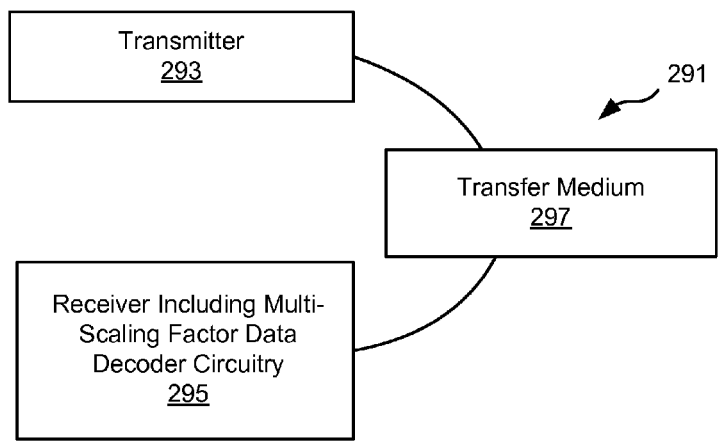
FIG. 2 depicts a data transmission system including a receiver having multi-scaling value data decoder circuitry in accordance with one or more embodiments of the present invention.

Turning to FIG. 2, a data transmission system 291 including a receiver 295 having skip layer enabled data decoder circuitry in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data.

As part of processing the received information, receiver 295 utilizes a data decoder circuit that includes an ability to apply different scaling values during a single local iteration through the data decoder circuit. As an example, one scaling value may be applied to processing one row of a data set, and a different scaling value applied to processing a different row of the same data set. The scaling value that is to be applied to a particular row may be selected based upon one or more characteristics. For example, in one particular embodiment of the present invention, a first scaling value is selected for all rows of a given data set where no trapping set is indicated. One of a second scaling value or a third scaling value is selected when a trapping set is indicated. In such a situation where a trapping set is indicated, the second scaling value is used where there are no errors indicated on the particular row, and the third scaling value is used where there are errors indicated on the particular row. Such an approach of using different scaling values during a given local iteration of a data decoding circuit may be used to overcome a trapping set that otherwise impedes the possibility of convergence of the data decoder circuit. Based upon the disclosure provided herein, one of ordinary skill in the art will recognize a variety of other advantages that may be achieved through use of one or more embodiments of the present invention. In some cases, receiver 295 may be implemented to include a data processing circuit similar to that discussed below in relation to FIG. 3. The data processing circuit may include a data decoder circuit including multi-scaling value circuitry similar to that discussed below in relation to FIG. 4. In one or more embodiments of the present invention, the data processing may be performed similar to that discussed below in relation to FIGS. 5a-5d. Alternatively, or in addition, the data processing may be performed similar to that discussed below in relation to FIG. 6. FIGS. 5a-5d are particularly tailored to real time processing, and FIG. 6 is particularly tailored to retry processing.

Figure 3:
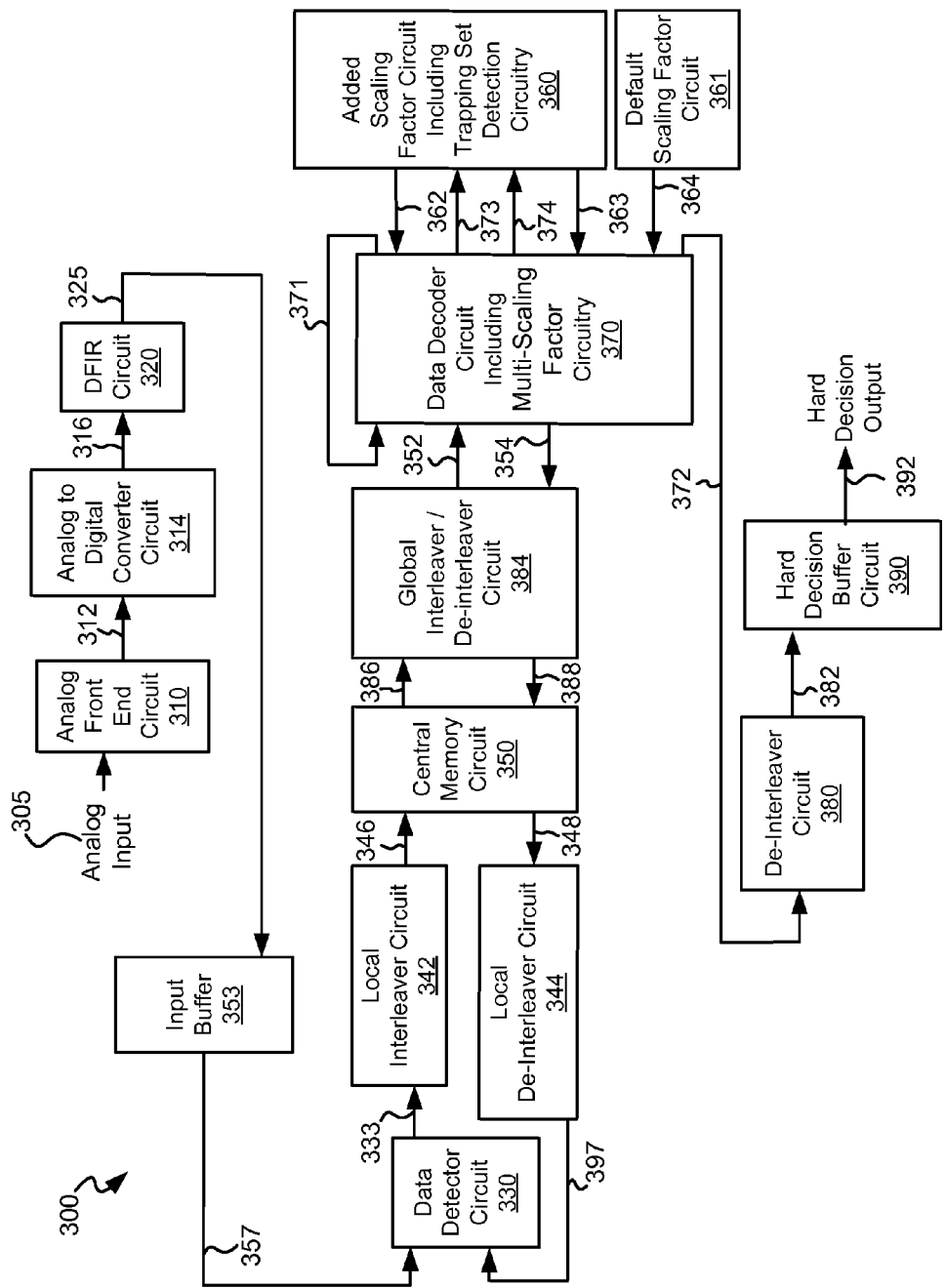
FIG. 3 shows a data processing circuit including a data decoder circuit including multi-scaling value circuitry in accordance with some embodiments of the present invention.

Turning to FIG. 3, a data processing circuit 300 including a data decoder circuit 370 including multi-scaling value circuitry is shown in accordance with some embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain a number of codewords until processing of that codeword is completed through a data detector circuit 330 and a layered data decoding circuit 370 including, where warranted, multiple global iterations (passes through both data detector circuit 330 and layered data decoding circuit 370) and/or local iterations (passes through layered data decoding circuit 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once data decoder circuit 370 is available, a previously stored interleaved codeword 346 is accessed from central memory circuit 350 as a stored codeword 386 and globally interleaved by a global interleaver/de-interleaver circuit 384. Global interleaver/de-interleaver circuit 384 may be any circuit known in the art that is capable of globally rearranging codewords. Global interleaver/De-interleaver circuit 384 provides a decoder input 352 into layered data decoding circuit. In some embodiments of the present invention, the data decode algorithm is a layered low density parity check algorithm as are known in the art. In other embodiments of the present invention, the data decode algorithm is a non-layered low density parity check algorithm as are known in the art. Based upon the disclosure provided herein, one of ordinary skill in the art will recognize a variety of data decode algorithms that may be used in relation to different embodiments of the present invention.

Data decoder circuit 370 applies the data decode algorithm to decoder input 352 to yield a decoded output 371. In cases where another local iteration (i.e., another pass trough data decoder circuit 370) is desired or allowed, data decoder circuit 370 re-applies the data decode algorithm to decoder input 352 guided by decoded output 371. This continues until either a maximum number of local iterations is exceeded or decoded output 371 converges (i.e., completion of standard processing).

During such application of the data decode algorithm by data decoder circuit 370 over multiple local iterations, data decoder circuit 370 may apply a message scaling value selected from one of a default scaling value 364 received from a default scaling value circuit 361 or an added scaling value 362 received from an added scaling value circuit 360 including trapping set detection circuitry.

Default scaling value circuit 361 may be a register that stores a user programmable scaling value that is provided as default scaling value 361. Alternatively, default scaling value circuit 361 may be an adaptive circuit that generates a scaling value based upon feedback from one or more components of data processing circuit 300 as are known in the art. Based upon the disclosure provided herein, one of ordinary skill in the art will recognize a variety of implementations of default scaling value circuit that may be used in relation to different embodiments of the present invention.

Added scaling value circuit 360 is operable to select between two different scalar values with the selected one of the scalar values being provided as added scaling value 362. The selection of one of the scalar values is based upon an error indicator 373 provided from data decoder circuit 370. Error indicator 373 is asserted to indicate the presence of an error (e.g., an unsatisfied check) in a particular row of a data set being processed. In some embodiments of the present invention, data decoder circuit 370 applies a parity check equation (i.e., calculates a syndrome) on a row by row basis of the data set being processed. Whenever the parity check equation fails to yield a zero value, error indicator 373 is asserted to indicate the presence of an error in the processing data set. Otherwise, where the parity check equation yields a zero, error indicator 373 is asserted to indicate the lack of an error in the processing data set.

In addition, added scaling value circuit 360 is operable to detect the possibility of a trapping set based upon an output 374 of data decoder circuit 370. Output 374 is substantially the same as decoded output 371. Where a trapping set is detected, a tapping set indicator 363 is asserted to indicate the presence of a trapping set. Alternatively, where a trapping set is not detected, trapping set indicator 363 is asserted indicating the lack of a tracking set.

A trapping set may be detected using a variety of indicia. For example, in one embodiment of the present invention, a trapping set is indicated where the number of unsatisfied parity check equations for an overall data set is less than a threshold value and the location of the unsatisfied parity check equations remains the same for a defined number of consecutive local iterations through data decoder circuit 370. In one particular embodiment of the present invention, the threshold value is ten (10), and the number of consecutive local iterations through data decoder circuit is three (3). Based upon the disclosure provided herein, one of ordinary skill in the art will recognize other numbers of consecutive local iterations and/or threshold values that may be used in relation to different embodiments of the present invention.

In another embodiment of the present invention, a trapping set is indicated where the number of unsatisfied parity check equations for an overall data set remains constant over a defined number of global iterations through both data detector circuit 330 and data decoder circuit 370. In one particular embodiment of the present invention, the number of consecutive global iterations is four (4). Based upon the disclosure provided herein, one of ordinary skill in the art will recognize other numbers of consecutive global iterations that may be used in relation to different embodiments of the present invention. Based upon the disclosure provided herein, one of ordinary skill in the art will appreciate that other indicia of a trapping set may be used in relation to other embodiments of the present invention.

Where tapping set indicator 363 is asserted to indicate that no trapping set is indicated, data decoder circuit 370 applies default scaling value 364 during application of the data decode algorithm to each of the rows of the data set being processed. Alternatively, where tapping set indicator 363 is asserted to indicate that a trapping set is indicated, data decoder circuit 370 applies added scaling value 362 during application of the data decode algorithm. Added scaling value circuit 360 changes the value of added scaling value 362 depending upon whether the currently processing row of the data set exhibits any errors as indicated by error indicator 373 provided from data decoder circuit 370. As such, data decoder circuit 370 is operable to apply a scaling value selected on a local iteration by local iteration basis, and row by row basis of a data set being processed during a local iteration in an effort to mitigate an identified trapping set.

Where decoded output 371 fails to converge (i.e., fails to yield the originally written data set) and a number of local iterations through layered data decoding circuit 370 exceeds a threshold, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 is accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a de-interleaver circuit 380 that rearranges the data to reverse both the global and local interleaving applied to the data to yield a de-interleaved output 382. De-interleaved output 382 is provided to a hard decision buffer circuit 390 that arranges the received codeword along with other previously received codewords in an order expected by a requesting host processor. The resulting output is provided as a hard decision output 392.

Figure 4:
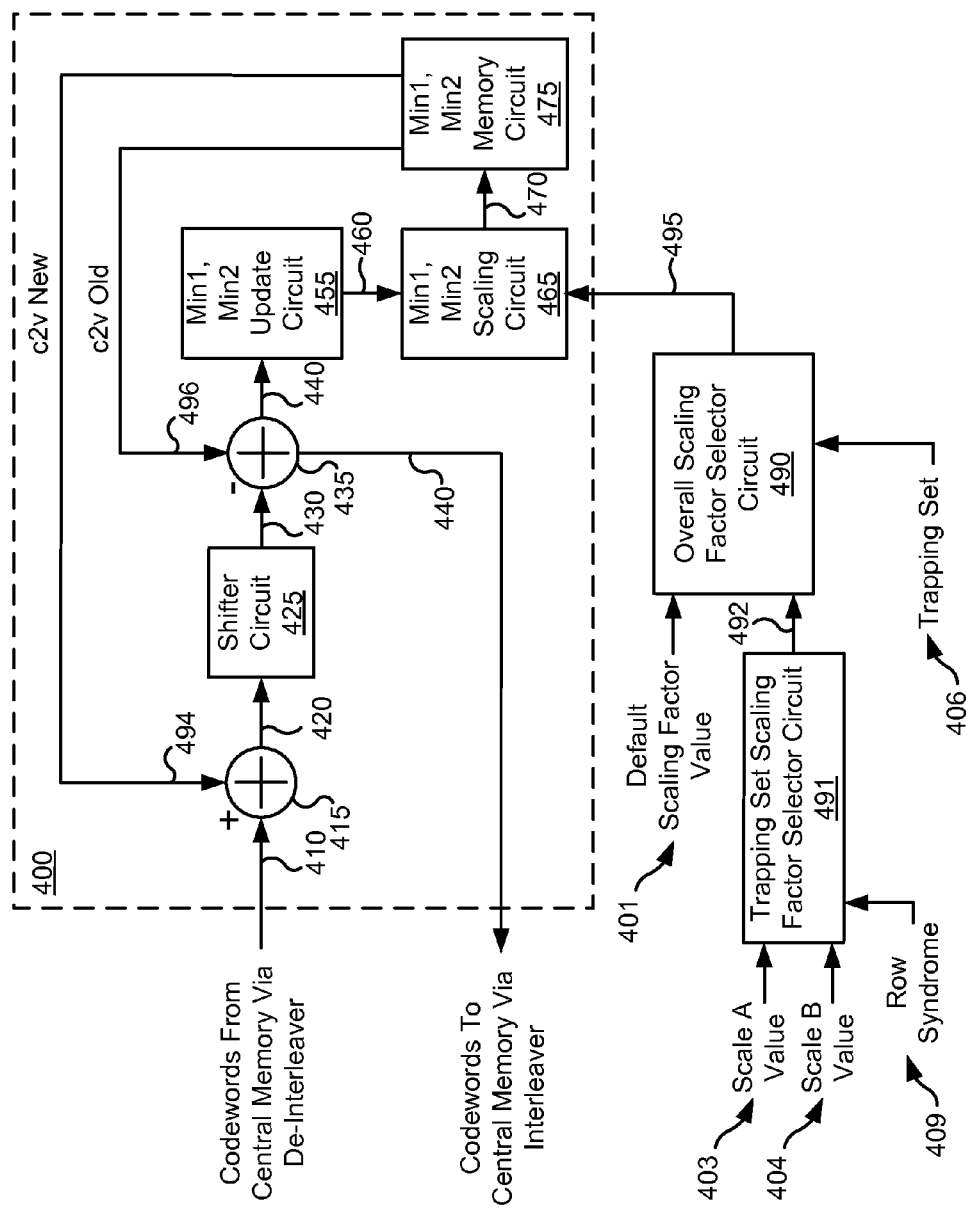
FIG. 4 shows an example implementation of a data decoder circuit including multi-scaling value circuitry that may be used in relation to different embodiments of the present invention.
Figure 5A:
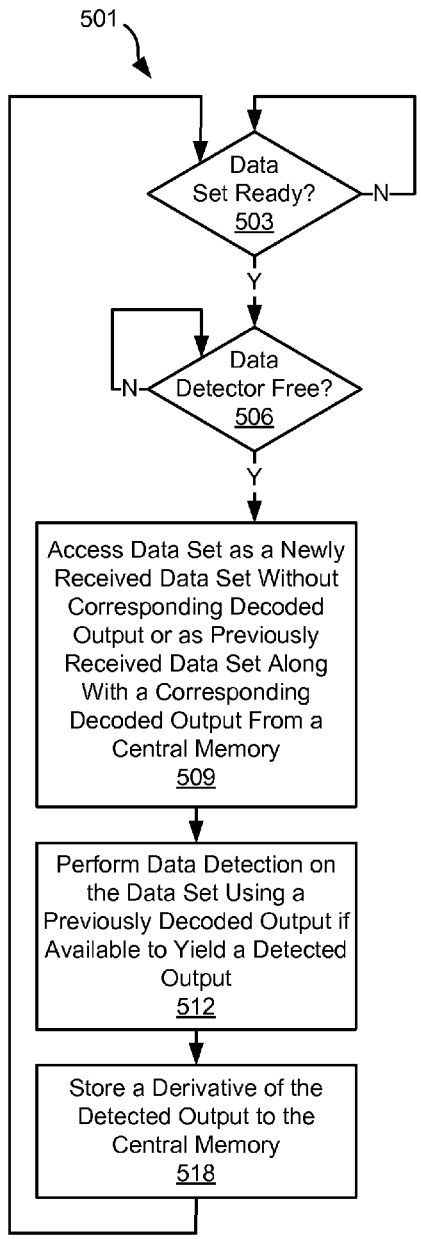
FIGS. 5$a$-5$d$ are flow diagrams showing a method for performing data processing including application of a data decode algorithm using multiple scaling values during a given local iteration through a data decoder circuit.

Turning to FIG. 4, an example implementation of a data decoder circuit 400 including multi-scaling value circuitry is shown that may be used in relation to different embodiments of the present invention. Data decoder circuit 400 may be used as part of data decoder circuit 370 of FIG. 3. Data decoder circuit 400 includes a summation circuit 415 that adds a selected codeword (i.e., a circulant of a selected codeword) 410 to a new c2v message 494 to yield a first sum 420. First sum 420 is provided to a shifter circuit 425 that is operable to rotate a quasi cyclic input to yield a shifted output 430. Shifter circuit 425 may be any circuit known in the art that is capable of shifting codewords including quasi-cyclic circulants. Shifted output 430 is provided to a summation circuit 435 where an old c2v message 496 is subtracted therefrom to yield a second sum 440. Second sum 440 is provided back to the central memory 350 as codewords via interleaver circuit 384. This replaces the previous instance of codewords for the currently processing codeword.

In addition, second sum 440 is provided to a min 1, min 2 update circuit 455. Min 1, min 2 update circuit 455 selects the minimum distance (i.e., min 1) and the next minimum distance (i.e., min 2) to the next trellis node. Min 1, min 2 update circuit 455 may be any circuit known in the art for generating the first and second minimum distance values. Based upon the disclosure provided herein, one of ordinary skill in the art will recognize a variety of implementations of min 1, min 2 update circuit 455 that may be used in relation to different embodiments of the present invention.

Min 1, min 2 update circuit 455 provides the generated min 1 and min 2 values as an output 460 to a min 1, min 2 scaling circuit 465. Min 1, min 2 scaling circuit 465 scales output 460 by a scalar value 495 to yield scaled mini, min 2 values 470 that are provided to a min 1, min 2 memory circuit 475. Min 1, min 2 scaling circuit 465 may be any circuit known in the art that is capable of applying a scalar to a received value to yield a scaled value. In one particular embodiment of the present invention, min 1, min 2 scaling circuit 465 is a multiplier circuit. Min 1, min 2 memory circuit 475 retains a previous instances of scaled min 1, min 2 values 470 as c2v old message 496, and the current instance of scaled min 1, min 2 values 475 as c2v new message 494. The storage of min 1, min 2 memory circuit 475 is updated.

As shown, scalar value 495 is selected depending upon conditions indicated by data decoder circuit 370 including whether a trapping set is identified as indicated by assertion of a trapping set indicator 406, and a syndrome calculated for a particular row of a data set indicated as a row syndrome 409. A trapping set scaling value selector circuit 491 selects between either a scale A value 403 or a scale B value 404 depending upon whether row syndrome 409 is zero or non-zero for the current row. In particular, where row syndrome 409 is non-zero (indicating one or more errors for the row) for the particular row of the data set being processed, scale A value 403 is selected as an added scaled value 492. Alternatively, where row syndrome 409 is zero (indicating no errors for the row) for the particular row of the data set being processed, scale B value 404 is selected as an added scaled value 492. In some embodiments of the present invention, scale A value 403 is equal to or greater than scale B value 404. In some cases, the values are selectable in increments of 0.125. In such a case where scale A value 403 is selected as 1.0, then scale B value 404 may be any of 1.0, 0.875, 0.75, 0.625, 0.5, 0.375, 0.25, 0.125 or 0.0. Where scale A value 403 is selected as 0.875, then scale B value 404 may be any of 0.875, 0.75, 0.625, 0.5, 0.375, 0.25, 0.125 or 0.0. Where scale A value 403 is selected as 0.75, then scale B value 404 may be any of 0.75, 0.625, 0.5, 0.375, 0.25, 0.125 or 0.0. Based upon the disclosure provided herein, one of ordinary skill in the art will recognize a variety of values that may be selected for scale A value 403 and scale B value 404 in accordance with different embodiments of the present invention.

Added scaled value 492 is provided to an overall scaling value selector circuit 490. Overall scaling value selector circuit 490 selects between added scaled value 492 and a default scaling value 401 to be provided as scalar value 495 depending upon trapping set indicator 406. In particular, where trapping set indicator 406 is asserted such that a trapping set is indicated for the currently processing data set data set including the row represented by row syndrome 409, added scaled value 492 is selected as scalar value 495. Alternatively, where trapping set indicator 406 is asserted such that a trapping set is not indicated for the currently processing data set data set including the row represented by row syndrome 409, default scaling value 401 is selected as scalar value 495. By using this selection scheme, a standard scaling value may be selected when processing data sets until a trapping set is identified. When a trapping set is identified, a scaling value may be selected on a row by row basis depending upon the syndrome calculated for the particular row of the data set being processed. Thus, when applying the data decode algorithm to a data set after a trapping set is identified, a different scaling value may be applied to one row and then a different scaling value to another row during the same local iteration. Such an approach may be used to perturb the data decoding process and thereby potentially break the trapping set.

Turning to FIG. 5a-5d, flow diagrams 500, 501, 507a, 507b show a method for performing data processing including application of a data decode algorithm using multiple scaling values during a given local iteration through a data decoder circuit. Following flow diagram 501 of FIG. 5a, it is determined whether a data set or codeword is ready for application of a data detection algorithm (block 503). In some cases, a data set is ready when it is received from a data decoder circuit via a central memory circuit. In other cases, a data set is ready for processing when it is first made available from a front end processing circuit. Where a data set is ready (block 503), it is determined whether a data detector circuit is available to process the data set (block 506).

Where the data detector circuit is available for processing (block 506), the data set is accessed by the available data detector circuit (block 509). The data detector circuit may be, for example, a Viterbi algorithm data detector circuit or a maximum a posteriori data detector circuit. Where the data set is a newly received data set (i.e., a first global iteration), the newly received data set is accessed. In contrast, where the data set is a previously received data set (i.e., for the second or later global iterations), both the previously received data set and the corresponding decode data available from a preceding global iteration (available from a central memory) is accessed. The accessed data set is then processed by application of a data detection algorithm to the data set (block 512). Where the data set is a newly received data set (i.e., a first global iteration), it is processed without guidance from decode data available from a data decoder circuit. Alternatively, where the data set is a previously received data set (i.e., for the second or later global iterations), it is processed with guidance of corresponding decode data available from preceding global iterations. Application of the data detection algorithm yields a detected output. A derivative of the detected output is stored to the central memory (block 518). The derivative of the detected output may be, for example, an interleaved or shuffled version of the detected output.

Figure 5B:
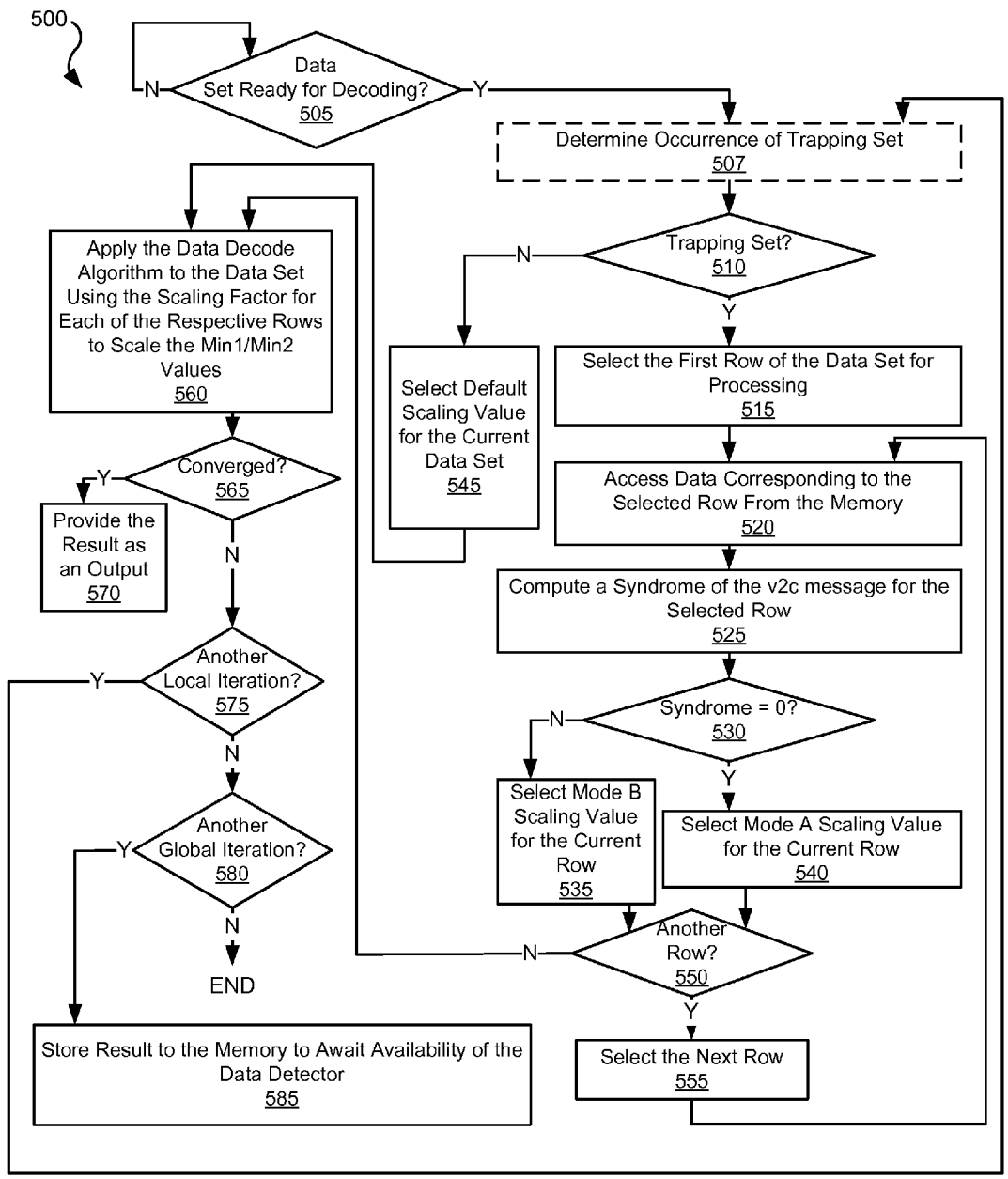

Turning to FIG. 5b and following flow diagram 500, it is determined whether a data set or codeword is ready for processing by a data decoder circuit (block 505). A data set may become available after processing through an upstream data detector circuit has completed. It is then determined whether a trapping set has occurred (block 507). As described below in relation to FIGS. 5c-5d, a variety of a approaches may be used in relation to different embodiments of the present invention for determining the occurrence of a trapping set.

Where it is determined that no trapping set is at issue for the currently processing data set (block 510), a default scaling value is selected for use in relation to the currently processing data set (block 545). This default scaling value is to be applied in relation to processing all rows of the currently processing data set. Alternatively, where it is determined that a trapping set is at issue for the currently processing data set (block 510), the first row of the data set is selected for processing (block 515) and the selected row is accessed from the memory (block 520). A syndrome value of the variable node to check node (v2c) message is computed for the selected row (block 525). Any approach for syndrome calculation known in the art may be used.

Where the calculated syndrome is equal to zero (i.e., indicating the absence of errors) (block 530), a mode A scaling value is selected to be used in relation to the selected row (block 540). Alternatively, where the calculated syndrome is not equal to zero (i.e., indicating the existence of errors) (block 530), a mode B scaling value is selected to be used in relation to the selected row (block 535). In some embodiments of the present invention, mode A scaling value is less than or equal to mode B scaling value. In some cases, the values are selectable in increments of 0.125. In such a case where scale B value is selected as 1.0, then scale A value may be any of 1.0, 0.875, 0.75, 0.625, 0.5, 0.375, 0.25, 0.125 or 0.0. Where scale B value is selected as 0.875, then scale A value may be any of 0.875, 0.75, 0.625, 0.5, 0.375, 0.25, 0.125 or 0.0. Where scale B value is selected as 0.75, then scale A value may be any of 0.75, 0.625, 0.5, 0.375, 0.25, 0.125 or 0.0. Based upon the disclosure provided herein, one of ordinary skill in the art will recognize a variety of values that may be selected for scale A value and scale B value in accordance with different embodiments of the present invention. It is then determined whether another row remains in the data set to be processed (block 550). Where another row remains (block 550), the next row in the data set is selected (block 555), and the processes of blocks 520-550 are repeated for the next row.

Alternatively, where either no additional rows remain to be processed (block 550) or the default scaling sector is selected (block 545), the data decode algorithm is applied to the data set using the scaling value for each of the respective rows in the data set to scale the Min1/Min2 values (block 560). Thus, where no trapping set is indicated (block 510), the data decode algorithm is applied to the data set using the default scaling value for all of the respective rows in the data set to scale the Min1/Min2 values. Alternatively, where a trapping set is indicated and the syndrome is equal to zero (block 510 and block 530), the data decode algorithm is applied to the data set using the mode A scaling value for the respective row in the data set to scale the Min1/Min2 values. As yet another alternative, where a trapping set is indicated and the syndrome is not equal to zero (block 510 and block 530), the data decode algorithm is applied to the data set using the mode B scaling value for the respective row in the data set to scale the Min1/Min2 values.

It is then determined whether application of the data decode algorithm converged (i.e., resulted in a correction of all errors) (block 565). Where the data decode algorithm converged (block 565), the result is provided as an output (block 570). Alternatively, where the data decode algorithm failed to converge (block 565), it is determined whether another local iteration through the data decoder circuit is allowed (block 575). In some cases, seven (7) to ten (10) local iterations are allowed during each global iteration. Based upon the disclosure provided herein, one of ordinary skill in the art will recognize a variety of numbers of allowable local iterations that may be used in relation to different embodiments of the present invention.

Where another local iteration is allowed (block 575), the process of readjusting the utilized scaling values is repeated using the current result (blocks 507-555), and application of the data decode algorithm is repeated (blocks 560-565). Alternatively, where another local iteration is not allowed (block 575), it is determined whether another global iteration is allowed (block 580). Where another global iteration is not allowed (block 580), a timeout condition has occurred and the process ends without yielding a corrected result. Alternatively, where another global iteration is allowed (block 580), the result of the decoding process is stored to the memory to await availability of the data detector to start the next global iteration (block 585).

Figure 5C:
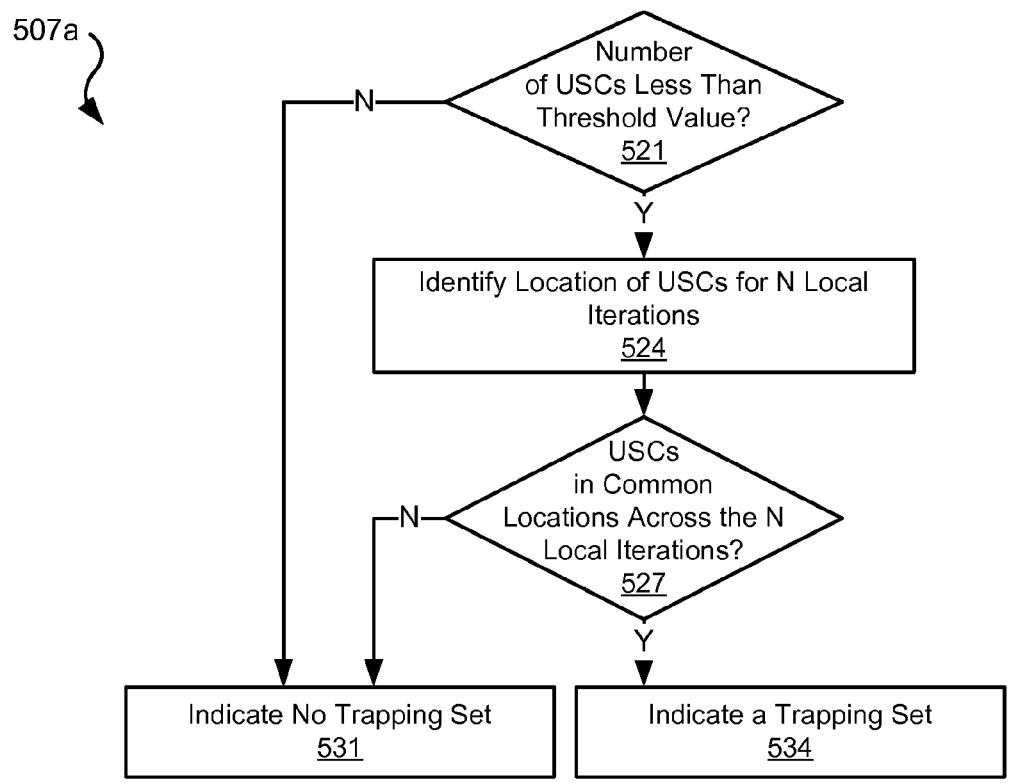
Figure 6:
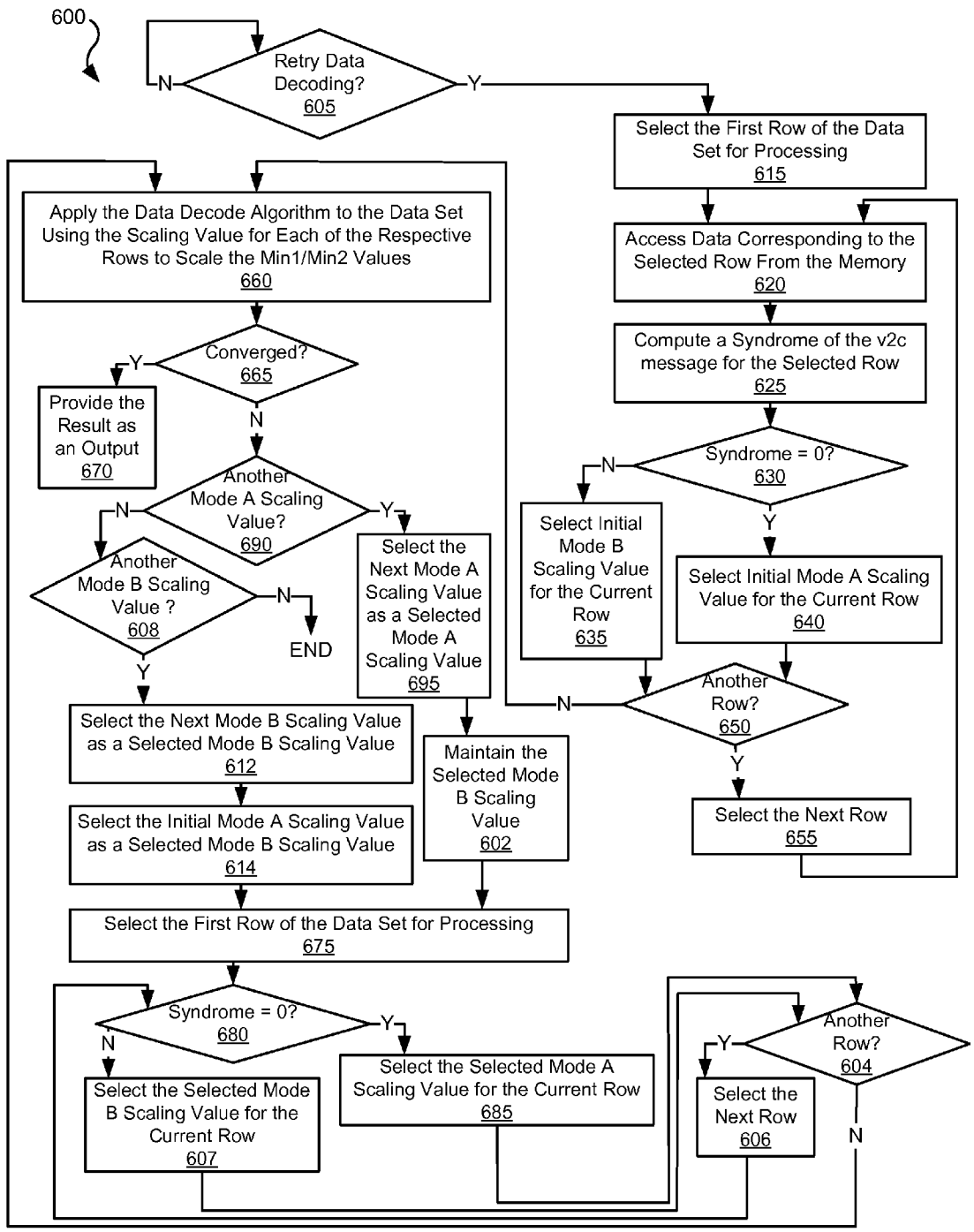
FIG. 6 is a flow diagram showing a method for performing data processing including application of a data decode algorithm using multiple scaling values during a given local iteration through a data decoder circuit where different combinations of the multiple scaling values are swept in an effort to help the data processing converge.

Turning to FIG. 5c, an approach for determining a trapping set that may be used in place of block 507 of FIG. 5b is shown. Following flow diagram 507a of FIG. 5c, it is determined whether a number of unsatisfied checks remaining in a decoded output is less than a threshold value (block 521). In some embodiments of the present invention, the threshold value is ten (10). Where the number of remaining unsatisfied checks is not less than the threshold value (block 521), no trapping set is indicated (block 531). Alternatively, where the number of remaining unsatisfied checks is not less than the threshold value (block 521), the location of the remaining unsatisfied checks is determined over N local iterations (block 524). In some embodiments of the present invention, the value of N is three (3). Where the unsatisfied checks are not in the same locations for the N local iterations (block 527), no trapping set is indicated (block 531). Alternatively, where the unsatisfied checks are in the same locations for the N local iterations (block 527), a trapping set is indicated (block 534).

Figure 5D:
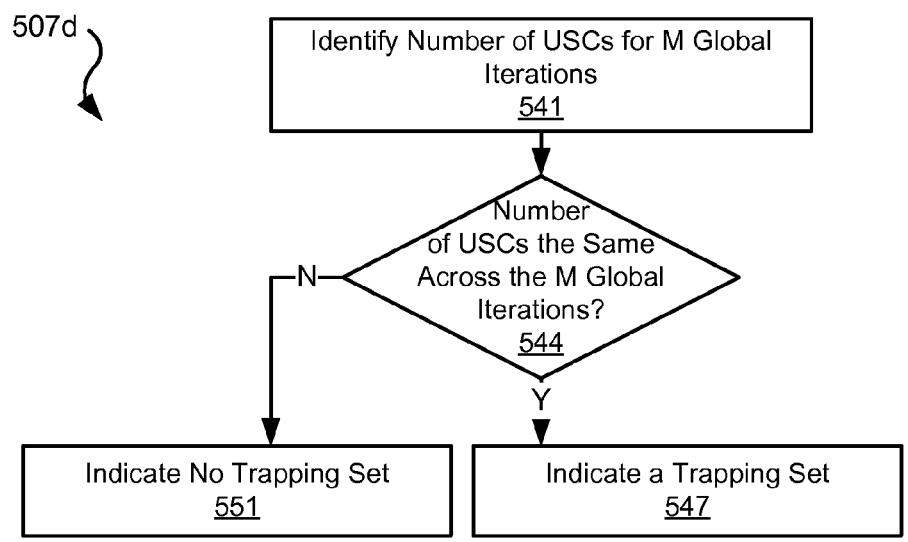

Turning to FIG. 5d, another approach for determining a trapping set that may be used in place of block 507 of FIG. 5b is shown. Following flow diagram 507b of FIG. 5d, the number of unsatisfied checks is determined for M global iterations (block 541). In some embodiments of the present invention, M is three (3). It is then determined whether the number of unsatisfied checks has remained constant over the M global iterations (block 544). Where the number of unsatisfied checks has changed over the M global iterations (block 544), no trapping set is indicated (block 551). Alternatively, where the number of unsatisfied checks has not changed over the M global iterations (block 544), a trapping set is indicated (block 547).

Turning for FIG. 6, a flow diagram 600 shows a method for performing data processing including application of a data decode algorithm using multiple scaling values during a given local iteration through a data decoder circuit where different combinations of the multiple scaling values are swept in an effort to help the data processing converge. The method of FIG. 6 is tailored to a retry mode where a number of combinations of scaling values can be utilized in an attempt to converge. In such a case, it is assumed that a trapping set has occurred, and thus no trapping set checking is included and there is no use of a default scaling value. It should be noted that a trapping set check similar to that discussed above in relation to FIG. 5b may be included in relation to flow diagram 600, and in such case a default scaling value may be used.

Following flow diagram 600, the first row of the data set is selected for processing (block 615) and the selected row is accessed from the memory (block 620). A syndrome value of the variable node to check node (v2c) message is computed for the selected row (block 625). Any approach for syndrome calculation known in the art may be used.

Where the calculated syndrome is equal to zero (i.e., indicating the absence of errors) (block 630), an initial mode A scaling value is selected to be used in relation to the selected row (block 640). Alternatively, where the calculated syndrome is not equal to zero (i.e., indicating the existence of errors) (block 630), an initial mode B scaling value is selected to be used in relation to the selected row (block 635). In some embodiments of the present invention, mode A scaling value is less than or equal to mode B scaling value. In some cases, the values are selectable in increments of 0.125. In such a case where scale B value is selected as 1.0, then scale A value may be any of 1.0, 0.875, 0.75, 0.625, 0.5, 0.375, 0.25, 0.125 or 0.0. Where scale B value is selected as 0.875, then scale A value may be any of 0.875, 0.75, 0.625, 0.5, 0.375, 0.25, 0.125 or 0.0. Where scale B value is selected as 0.75, then scale A value may be any of 0.75, 0.625, 0.5, 0.375, 0.25, 0.125 or 0.0. Based upon the disclosure provided herein, one of ordinary skill in the art will recognize a variety of values that may be selected for scale A value and scale B value in accordance with different embodiments of the present invention. It is then determined whether another row remains in the data set to be processed (block 650). Where another row remains (block 650), the next row in the data set is selected (block 655), and the processes of blocks 620-650 are repeated for the next row.

Alternatively, where no additional rows remain to be processed (block 650), the data decode algorithm is applied to the data set using the scaling value for each of the respective rows in the data set to scale the Min1/Min2 values (block 660). Thus, where the syndrome is equal to zero (block 630), the data decode algorithm is applied to the data set using the mode A scaling value for the respective row in the data set to scale the Min1/Min2 values. Alternatively, where the syndrome is not equal to zero (block 630), the data decode algorithm is applied to the data set using the mode B scaling value for the respective row in the data set to scale the Min1/Min2 values.

It is then determined whether application of the data decode algorithm converged (i.e., resulted in a correction of all errors) (block 665). Where the data decode algorithm converged (block 665), the result is provided as an output (block 670). Alternatively, where the data decode algorithm failed to converge (block 665), it is determined whether another mode A scaling value for the currently selected mode B scaling value remains to be utilized (block 690). Where another mode A scaling value remains (block 690), the next mode A scaling value is selected as a selected mode A scaling value (block 695), and the previously selected mode B scaling value is retained as a selected mode B scaling value (block 602). Alternatively, where no other mode A scaling values remain (block 690), it is determined whether another mode B scaling value remains to be utilized (block 608). Where another mode B scaling value remains to be utilized (block 608), the next mode B scaling value is selected as a mode B scaling value (block 612) and the initial mode A scaling value is selected as the selected mode A scaling value (block 614). Alternatively, where no other mode B scaling values remain to be utilized (block 608), the process ends.

The first row of the data set is selected for processing (block 675). It is determined whether the previously calculated syndrome for the selected row was equal to zero (block 680). Where it is determined whether the previously calculated syndrome was equal to zero (block 680), the selected mode A scaling value is selected for the current row (block 685). Alternatively, where it is determined whether the previously calculated syndrome was not equal to zero (block 680), the selected mode B scaling value is selected for the current row (block 607).

It is then determined whether another row remains in the data set to be processed (block 604). Where another row remains (block 604), the next row in the data set is selected (block 606), and the processes of blocks 680, 607, 685, 604 are repeated for the next row. Alternatively, where no other row remains to be processed (block 604), the processes beginning at block 660 are repeated for the data set using the newly selected mode A scaling value and/or mode B scaling value.

Figure 7:
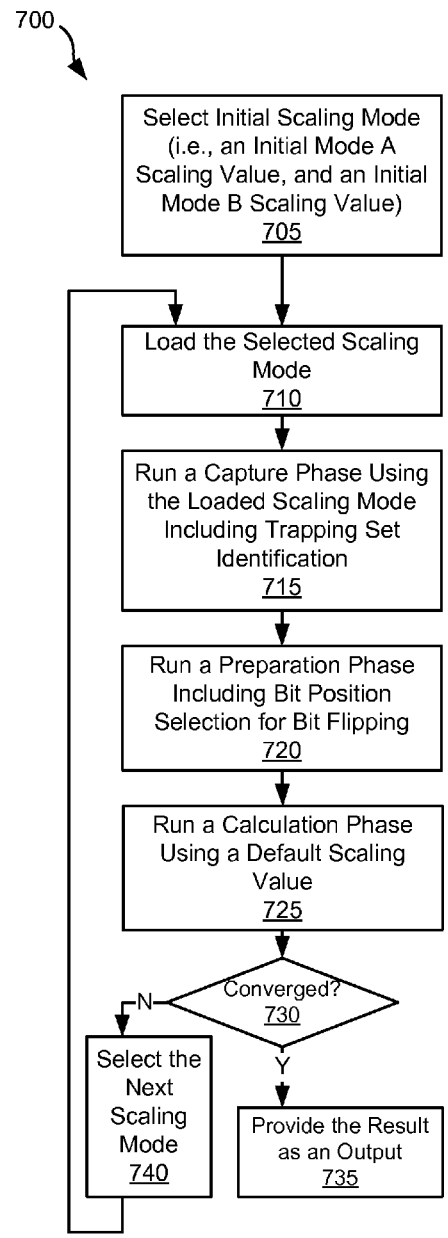

In some cases, the aforementioned approaches allowing for modified scalar values on a row by row basis may be applied to a data retry scheme utilizing bit flipping. Such bit flipping is known in the art to allow for processing. Turning to FIG. 7, a flow diagram 700 shows a method incorporating multiple scaling values based upon the detection of a trapping set and a syndrome value. Following flow diagram 700, an initial scaling mode is selected (block 705). The initial scaling mode includes an initial mode A scaling value and an initial mode B scaling value. This initial scaling mode is then loaded (block 710) and used in relation to a capture phase (block 715). This capture phase works somewhat like that described in relation to FIG. 5 where the scaling mode is selected based upon whether a trapping set is detected, and on row syndrome values. A preparation phase is then run to identify locations within a data set where bit flipping would yield the most advantageous results (block 720). Next, a calculation phase is run using a default scaling value (block 725). It is then determined whether the data set converged (block 730). Where the data set converged (block 730), the result is provided as an output (block 735). Otherwise, where the data set failed to converge (block 730), the next scaling mode is selected (block 740) and the processes of blocks 710-730 are repeated using the next scaling mode. The selection of the next scaling mode may be done similar to that discussed above in relation to FIG. 6.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
  a data decoder circuit operable to apply a data decode algorithm to a decoder input to yield a decoded output, wherein the decoder input includes at least a first portion and a second portion; and
  wherein applying the data decoding algorithm to the decoder input includes:
    determining a first condition associated with the first portion;
    determining a second condition associated with the second portion;
    applying a first scaling value to the first portion based at least in part upon the first condition, and
    applying a second scaling value to the second portion based at least in part upon the second condition.

2. The data processing system of claim 1, wherein determining the first condition and determining the second condition comprises:
- calculating a syndrome of the first portion to yield a first syndrome value, and wherein the first condition is a zero value of the first syndrome; and
- calculating a syndrome of the second portion to yield a second syndrome value, and wherein the second condition is a non-zero value of the second syndrome.

3. The data processing system of claim 1, wherein the first portion is a first row of the decoder input, and wherein the second portion is a second row of the decoder input.

4. The data processing system of claim 1, wherein applying the data decoding algorithm to the decoder input further includes:
- determining a third condition associated with the decoder input; and
- applying a third scaling value to both the first portion and the second portion based at least in part upon the third condition.

5. The data processing system of claim 4, wherein the third condition is the absence of a trapping set associated with the decoder input.

6. The data processing system of claim 1, wherein applying the data decoding algorithm to the decoder input further includes:
- determining a third condition associated with the decoder input;
- wherein applying the first scaling value to the first portion is based at least in part upon a combination of the first condition and the third condition; and
- wherein applying the second scaling value to the second portion is based at least in part upon a combination of the second condition and the third condition.

7. The data processing system of claim 6, wherein the third condition is the occurrence of a trapping set associated with the decoder input.

8. The data processing system of claim 1, wherein the data processing system further comprises:
- a data detector circuit operable to apply a data detection algorithm to a data input to yield a detected output, wherein the decoder input is derived from the detected output.

9. The data processing system of claim 8, wherein the data detector circuit is selected from a group consisting of: a Viterbi algorithm data detector circuit, and a maximum a posteriori data detector circuit.

10. The data processing system of claim 1, wherein the data decoder circuit is selected from a group consisting of: a layered low density parity check data decoder circuit, and a non-layered low density parity check data decoder circuit.

11. The data processing system of claim 1, wherein the data processing system is implemented as an integrated circuit.

12. The data processing system of claim 1, wherein the data processing system is incorporated in a device selected from a group consisting of: a storage device, and a data transmission device.

13. A data processing method, the data processing method comprising:
- receiving a decoder input, wherein the decoder input includes a first portion and a second portion;
- applying a data decoding algorithm to the decoder input by a data decoder circuit, wherein applying the data decoding algorithm includes:
  - determining a first condition associated with the first portion;
  - determining a second condition associated with the second portion;
  - applying a first scaling value to the first portion based at least in part upon the first condition, and
  - applying a second scaling value to the second portion based at least in part upon the second condition.

14. The method of claim 13, wherein determining the first condition comprises:
- calculating a syndrome of the first portion to yield a first syndrome value, and wherein the first condition is a zero value of the first syndrome; and
- calculating a syndrome of the second portion to yield a second syndrome value, and wherein the second condition is a non-zero value of the second syndrome.

15. The method of claim 13, wherein the first portion is a first row of the decoder input, and wherein the second portion is a second row of the decoder input.

16. The method of claim 13, wherein applying the data decoding algorithm to the decoder input further includes:
- determining a third condition associated with the decoder input, wherein the third condition is the absence of a trapping set associated with the decoder input; and
- applying a third scaling value to both the first portion and the second portion based at least in part upon the third condition.

17. The method of claim 13, wherein applying the data decoding algorithm to the decoder input further includes:
- determining a third condition associated with the decoder input, wherein the third condition is the occurrence of a trapping set associated with the decoder input;
- wherein applying the first scaling value to the first portion is based at least in part upon a combination of the first condition and the third condition; and
- wherein applying the second scaling value to the second portion is based at least in part upon a combination of the second condition and the third condition.

18. The method of claim 13, wherein the method further comprises:
- receiving a codeword;
- applying a data detection algorithm to a codeword to yield a detected output, wherein the decoder input is derived from the detected output.

19. A data processing system, the data processing system comprising:
- a data decoder circuit operable to apply a data decode algorithm to a decoder input to yield a decoded output, wherein the decoder input includes at least a first row and a second row; and
- wherein applying the data decoding algorithm to the decoder input includes:
  - determining a first condition associated with the first row of the decoder input;
  - determining a second condition associated with the second row of the decoder input;
  - applying a first scaling value to the first row based at least in part upon the first condition, and
  - applying a second scaling value to the second row based at least in part upon the second condition.

20. The data processing system of claim 19, wherein applying the data decoding algorithm to the decoder input further includes:
- determining an absence of a trapping set associated with the decoder input; and
- applying a third scaling value to both the first row and the second row based at least in part upon the absence of a trapping set.

* * * * *